US010481184B2

(12) United States Patent
Urakawa et al.

(10) Patent No.: US 10,481,184 B2
(45) Date of Patent: Nov. 19, 2019

(54) INPUT-VOLTAGE-ABNORMALITY DETECTION METHOD AND POWER SOURCE DEVICE

(71) Applicant: Sumitomo Electric Industries, Ltd., Osaka-shi (JP)

(72) Inventors: Fumio Urakawa, Osaka (JP); Tetsuo Akita, Osaka (JP); Koichi Takeshita, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 81 days.

(21) Appl. No.: 15/747,296

(22) PCT Filed: Jun. 7, 2016

(86) PCT No.: PCT/JP2016/066940
§ 371 (c)(1),
(2) Date: Jan. 24, 2018

(87) PCT Pub. No.: WO2017/022329
PCT Pub. Date: Feb. 9, 2017

(65) Prior Publication Data
US 2018/0217187 A1    Aug. 2, 2018

(30) Foreign Application Priority Data

Aug. 4, 2015    (JP) ................. 2015-153946

(51) Int. Cl.
*G01R 19/165*    (2006.01)
*G01R 31/42*    (2006.01)
*H02H 7/20*    (2006.01)
*H02J 9/06*    (2006.01)

(52) U.S. Cl.
CPC ....... *G01R 19/16547* (2013.01); *G01R 31/42* (2013.01); *H02H 7/20* (2013.01); *H02J 9/062* (2013.01)

(58) Field of Classification Search
USPC .......................................... 307/66
See application file for complete search history.

(56) References Cited

FOREIGN PATENT DOCUMENTS

| JP | H01-153969 A | 6/1989 |
|---|---|---|
| JP | 04-078572 U1 | 7/1992 |
| JP | H09-281160 A | 10/1997 |
| JP | H10-090314 A | 4/1998 |

(Continued)

*Primary Examiner* — Rexford N Barnie
*Assistant Examiner* — Xuan Ly
(74) *Attorney, Agent, or Firm* — Baker Botts L.L.P.; Michael A. Sartori (57) ABSTRACT

This abnormality detection method for a single-phase AC input voltage is executed by a control unit having a function of a phase locked loop, and includes: sequentially generating a simulated voltage waveform with a phase synchronized with the input voltage, by using the phase locked loop; and within a period until a next update of the generated simulated voltage waveform, comparing the instantaneous value of the input voltage with the simulated voltage waveform, and when the instantaneous value of the input voltage changes from a state of being along the simulated voltage waveform to a state of not being along the simulated voltage waveform, determining that the input voltage is abnormal.

9 Claims, 11 Drawing Sheets

(56) References Cited

FOREIGN PATENT DOCUMENTS

| | | | |
|---|---|---|---|
| JP | H10-210663 | A | 8/1998 |
| JP | H10-285932 | A | 10/1998 |
| JP | 2001-013175 | A | 1/2001 |
| JP | 2001-320835 | A | 11/2001 |
| JP | 2006-242739 | A | 9/2006 |
| JP | 2008-043144 | A | 2/2008 |
| JP | 2008-054483 | A | 3/2008 |
| JP | 2008-125169 | A | 5/2008 |
| JP | 2009-092504 | * | 4/2009 |
| JP | 2009-092504 | A | 4/2009 |
| JP | 2009-232521 | A | 10/2009 |
| JP | 2010-051098 | A | 3/2010 |
| JP | 2012-070055 | A | 4/2012 |
| JP | 2016-082655 | A | 5/2016 |
| WO | 0013290 | A1 | 3/2000 |

* cited by examiner

INPUT-VOLTAGE-ABNORMALITY DETECTION METHOD AND POWER SOURCE DEVICE

TECHNICAL FIELD

The present invention relates to a power supply device. In addition, the present invention relates to an input-voltage-abnormality detection method for mainly a power supply device. This application claims priority on Japanese Patent Application No. 2015-153946 filed on Aug. 4, 2015, the entire contents of which are incorporated herein by reference.

BACKGROUND ART

For example, an uninterruptible power supply device (UPS: Uninterruptible Power Supply) is a power supply device that normally charges a storage battery by a commercial AC power supply and upon power outage, converts the power stored in the storage battery to an AC power and outputs the AC power.

Such an uninterruptible power supply device is required to quickly and reliably detect power outage of an AC voltage. Regarding power outage detection, there are various proposals (for example, Patent Literature 1 to 6).

CITATION LIST

Patent Literature

PATENT LITERATURE 1: Japanese Laid-Open Patent Publication No. 2001-320835
PATENT LITERATURE 2: Japanese Laid-Open Patent Publication No. H10-285932
PATENT LITERATURE 3: Japanese Laid-Open Patent Publication No. H10-210663
PATENT LITERATURE 4: Japanese Laid-Open Patent Publication No. 2001-13175
PATENT LITERATURE 5: Japanese Laid-Open Patent Publication No. H10-90314
PATENT LITERATURE 6: Japanese Laid-Open Patent Publication No. H9-281160

SUMMARY OF INVENTION

A method of the present disclosure is an input-voltage-abnormality detection method for a single-phase AC input voltage, the method being executed by a control unit having a function of a phase locked loop, the method including: sequentially generating a simulated voltage waveform with a phase synchronized with the input voltage, by using the phase locked loop; and within a period until a next update of the generated simulated voltage waveform, comparing an instantaneous value of the input voltage with the simulated voltage waveform, and when the instantaneous value of the input voltage changes from a state of being along the simulated voltage waveform to a state of not being along the simulated voltage waveform, determining that the input voltage is abnormal.

In addition, a power supply device of the present disclosure is a power supply device including: a single-phase AC path from an input end to an output end in the power supply device; a first voltage sensor configured to detect an input voltage at the input end; a second voltage sensor configured to detect an output voltage at the output end; a conversion unit connected to the AC path and being capable of bidi- rectional power conversion; a storage battery connected to the AC path via the conversion unit; an AC switch provided between the input end and a point at which the conversion unit is connected to the AC path; and a control unit configured to control the conversion unit and the AC switch, thereby having a current conduction mode in which a power is supplied from the input end through the AC switch which is closed and the AC path, to reach the output end and thus supplied to a load connected to the output end, and a storage battery discharge mode in which the AC switch is opened and a power is supplied from the storage battery to the load via the conversion unit. The control unit has a function of a phase locked loop, and sequentially generates a simulated voltage waveform with a phase synchronized with the input voltage, by using the phase locked loop. Within a period until a next update of the generated simulated voltage waveform, the control unit compares an instantaneous value of the input voltage with the simulated voltage waveform, and when the instantaneous value of the input voltage changes from a state of being along the simulated voltage waveform to a state of not being along the simulated voltage waveform, the control unit determines that the input voltage is abnormal, and shifts from the current conduction mode to the storage battery discharge mode.

DESCRIPTION OF EMBODIMENTS

Problems to be Solved by the Present Disclosure

It is desirable to detect power outage as fast as possible. For example, if power outage is desired to be detected in 1 ms as a goal, it is difficult to achieve this by any of the power outage detection techniques described in the conventional art documents shown above. In addition, not only speed but also reliability (no erroneous detection) is required.

Figure 11:
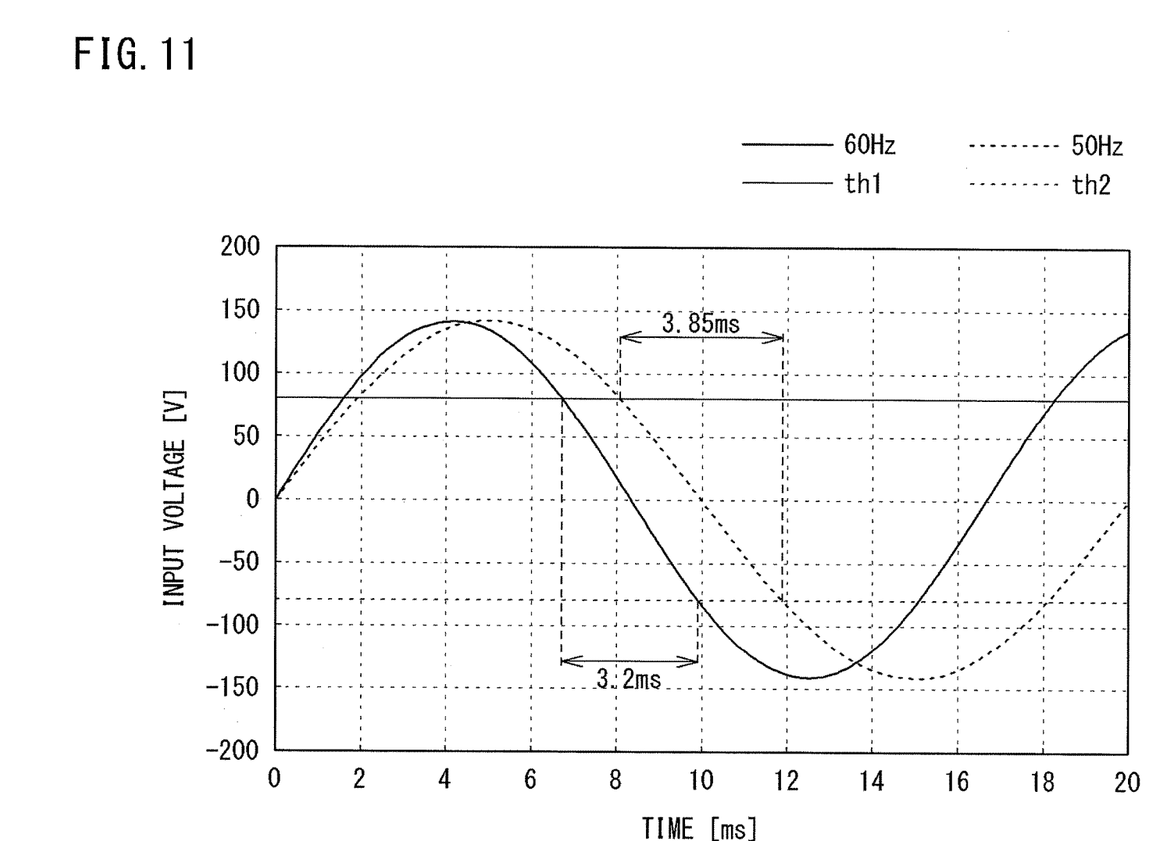
FIG. 11 is a waveform diagram showing the way for performing power outage detection by comparison with a voltage threshold value, as an example of a comparatively fast power outage detection method.

FIG. 11 is a waveform diagram showing the way for performing power outage detection by comparison with a voltage threshold value, as an example of a comparatively fast power outage detection method. The two waveforms are voltage waveforms of 60 Hz (solid line) and 50 Hz (dotted line), respectively. In a case where power outage is detected when the absolute value of an input voltage becomes equal to or smaller than a threshold value of 80 V (th1, th2 in the drawing), since the instantaneous value can become equal to or smaller than 80 V even in a normal state, it is necessary to discriminate from a normal state. In a normal state, in a case of 60 Hz, the absolute value becomes equal to or smaller than 80 V during a period of 3.2 ms. In a case of 50 Hz, the absolute value becomes equal to or smaller than 80 V during a period of 3.85 ms.

Therefore, in order to detect only power outage without erroneously detecting such a normal state, some margin time is needed. For example, it is necessary to confirm the state in which the absolute value is equal to or smaller than 80 V, by waiting for at least 5 ms. However, in a case of light load, the residual voltage left on the electric paths does not readily drop even if power outage occurs, and thus the time taken for detection is further prolonged.

Therefore, it is difficult to achieve extremely quick (e.g., 1 ms) and reliable power outage detection.

In view of the above conventional problem, an object of the present invention is to achieve extremely quick and reliable power outage detection for mainly a power supply device.

Effects of the Present Disclosure

According to the present disclosure, it is possible to achieve extremely quick and reliable power outage detection.

Summary of Embodiments

Summary of the embodiments of the present invention includes at least the following.

(1) This is an input-voltage-abnormality detection method for a single-phase AC input voltage, the method being executed by a control unit having a function of a phase locked loop, the method including: sequentially generating a simulated voltage waveform with a phase synchronized with the input voltage, by using the phase locked loop; and within a period until a next update of the generated simulated voltage waveform, comparing an instantaneous value of the input voltage with the simulated voltage waveform, and when the instantaneous value of the input voltage changes from a state of being along the simulated voltage waveform to a state of not being along the simulated voltage waveform, determining that the input voltage is abnormal.

In the abnormality detection method as described above, it is possible to have the simulated voltage waveform by phase synchronization made before abnormality occurs on the input voltage. Then, for example, if power outage occurs on the supplied input voltage, the instantaneous value of the input voltage falls into a state of not being along the simulated voltage waveform. This state can be extremely quickly and reliably detected as power outage. In addition, temporary abnormality of the input voltage can also be detected in the same manner.

(2) In the abnormality detection method of (1), when a difference voltage between the instantaneous value of the input voltage and the simulated voltage waveform is greater than a predetermined threshold value, the instantaneous value of the input voltage may be determined to be in the state of not being along the simulated voltage waveform.

In this case, it is possible to reliably perform the determination by comparing the difference voltage with the threshold value.

(3) In the abnormality detection method of (2), it is preferable that, when a state in which the difference voltage is greater than the threshold value has continued during a predetermined period, the input voltage is determined to be abnormal.

In this case, voltage variation that will be quickly restored, such as instantaneous power outage or instantaneous disturbance, can be prevented from being determined as abnormality of the input voltage.

(4) In another aspect, this is a power supply device including: a single-phase AC path from an input end to an output end in the power supply device; a first voltage sensor configured to detect an input voltage at the input end; a second voltage sensor configured to detect an output voltage at the output end; a conversion unit connected to the AC path and being capable of bidirectional power conversion; a storage battery connected to the AC path via the conversion unit; an AC switch provided between the input end and a point at which the conversion unit is connected to the AC path; and a control unit configured to control the conversion unit and the AC switch, thereby having a current conduction mode in which a power is supplied from the input end through the AC switch which is closed and the AC path, to reach the output end and thus supplied to a load connected to the output end, and a storage battery discharge mode in which the AC switch is opened and a power is supplied from the storage battery to the load via the conversion unit. The control unit has a function of a phase locked loop, and sequentially generates a simulated voltage waveform with a phase synchronized with the input voltage, by using the phase locked loop. Within a period until a next update of the generated simulated voltage waveform, the control unit compares an instantaneous value of the input voltage with the simulated voltage waveform, and when the instantaneous value of the input voltage changes from a state of being along the simulated voltage waveform to a state of not being along the simulated voltage waveform, the control unit determines that the input voltage is abnormal, and shifts from the current conduction mode to the storage battery discharge mode.

In the power supply device as described above, the control unit can have the simulated voltage waveform by phase synchronization made before abnormality occurs on the input voltage. Then, for example, if power outage occurs on the supplied input voltage, the instantaneous value of the input voltage falls into a state of not being along the simulated voltage waveform. This state can be extremely quickly and reliably detected as power outage. In addition, temporary abnormality of the input voltage can also be detected in the same manner. If the input voltage is determined to be abnormal, it is possible to continue supplying a power to the load by shifting from the current conduction mode to the storage battery discharge mode.

(5) In the power supply device of (4), for example, when a difference voltage between the instantaneous value of the input voltage and the simulated voltage waveform is greater than a threshold value for abnormality detection, the control unit can determine that the instantaneous value of the input voltage is in the state of not being along the simulated voltage waveform.

In this case, it is possible to reliably perform the determination by comparing the difference voltage with the threshold value.

(6) In the power supply device of (5), it is preferable that, when a state in which the difference voltage is greater than the threshold value has continued during a predetermined period, the control unit determines that the input voltage is abnormal.

In this case, voltage variation that will be quickly restored, such as instantaneous power outage or instantaneous disturbance, can be prevented from being determined as abnormality of the input voltage.

(7) In the power supply device of (5) or (6), for example, when the input voltage is restored after the shifting to the storage battery discharge mode, the control unit can synchronize a phase of an output voltage of the conversion unit with the input voltage, by using the phase locked loop, and when the phase synchronization is established, the control unit can shift from the storage battery discharge mode to the current conduction mode.

In this case, after power restoration, the phase of the output voltage of the conversion unit is finely adjusted to be synchronized with the phase of the input voltage, whereby mode shift can be performed.

(8) In the power supply device of (7), when the difference voltage has become smaller than a threshold value for synchronization detection, the control unit may determine that the phase synchronization is established.

In this case, it is possible to reliably perform the determination by comparing the difference voltage with the threshold value.

(9) In the power supply device of (8), the threshold value for abnormality detection and the threshold value for synchronization detection may be values different from each other.

In this case, it is possible to prevent shifting between the modes from being frequently performed within a short time.

Details of Embodiments

Hereinafter, the details of embodiments of the present invention will be described with reference to the drawings.

<<Circuit Configuration of Power Supply Device>>

Figure 1:
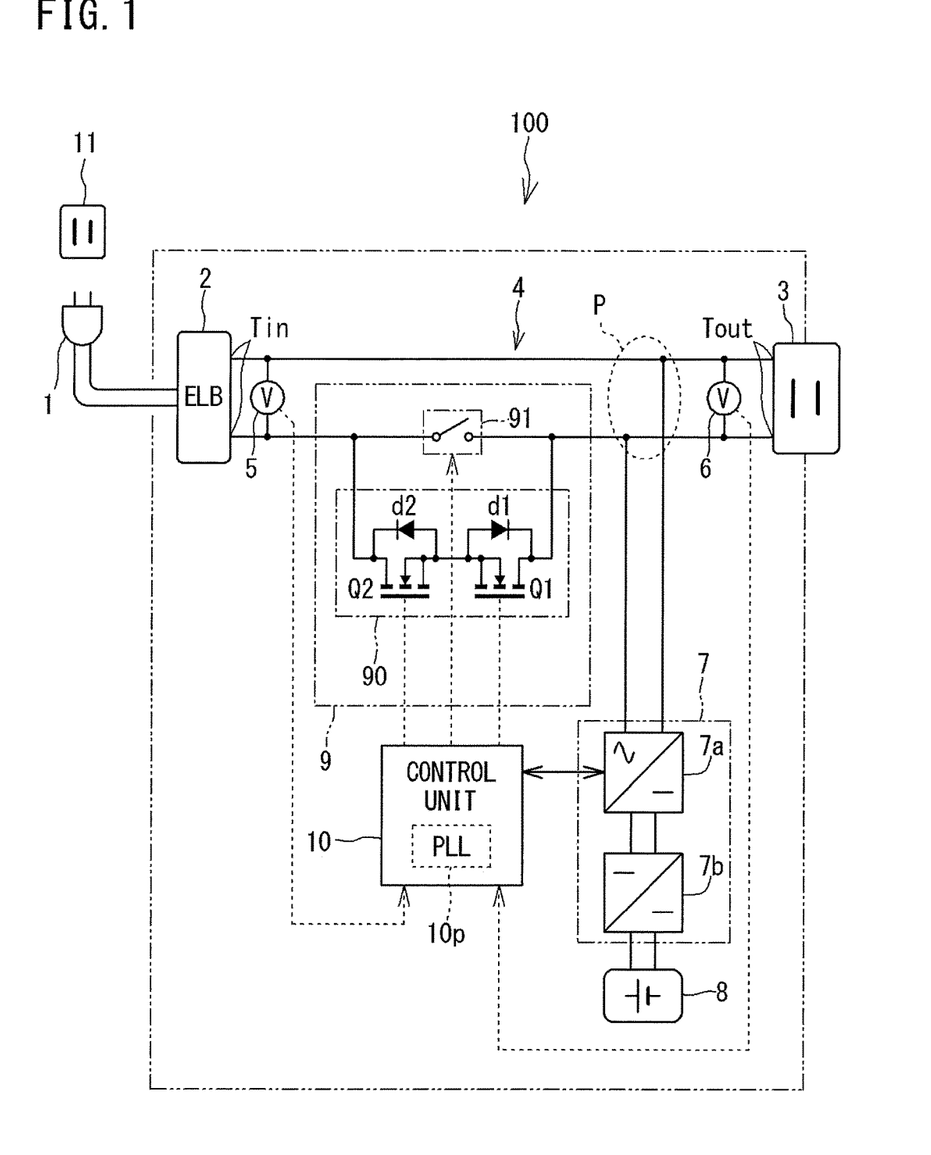
FIG. 1 is a circuit diagram showing a major part of a power supply device.

FIG. 1 is a circuit diagram showing a major part of a power supply device. In FIG. 1, the power supply device 100 includes: a plug 1 for AC (single-phase AC) input; an earth leakage circuit breaker 2 connected to the plug 1; an AC output outlet 3; single-phase AC paths 4 composed of two electric paths from an input end Tin to an output end Tout in the power supply device 100; a first voltage sensor 5 for detecting an input voltage at the input end Tin; a second voltage sensor 6 for detecting an output voltage at the output end Tout; a bidirectional inverter 7a and a DC/DC converter 7b as a conversion unit 7 connected to the AC paths 4 and capable of bidirectional power conversion; a storage battery 8 connected to the AC paths 4 via the conversion unit 7; an AC switch 9; and a control unit 10. Operation of the conversion unit 7 is controlled by the control unit 10.

In FIG. 1, the secondary side of the earth leakage circuit breaker 2 is regarded as the input end Tin. However, the primary side of the earth leakage circuit breaker 2 may be regarded as the input end Tin.

The AC switch 9 is interposed on one of the AC paths 4, between the input end Tin and a connection point P at which the conversion unit 7 is connected to the AC paths 4. The AC switch 9 includes a relay contact 91 to be electromagnetically driven, and a bidirectional semiconductor switch 90 connected in parallel to the relay contact 91. The semiconductor switch 90 is composed of a pair of semiconductor switch elements Q1, Q1 having parallel diodes d1, d2 and connected in series in directions opposite to each other.

The semiconductor switch elements Q1, Q2 are, for example, MOSFETs (Metal-Oxide-Semiconductor Field Effect Transistors), and the parallel diodes d1, d2 are body diodes. It is noted that the semiconductor switch elements Q1, Q2 may be IGBTs (Insulated Gate Bipolar Transistors) having parallel diodes d1, d2.

The relay contact 91 and the semiconductor switch elements Q1, Q2 are controlled by the control unit 10. In addition, detection signals from the first voltage sensor 5 and the second voltage sensor 6 are sent to the control unit 10.

The control unit 10 includes, for example, a computer, and achieves a necessary control function by the computer executing software (computer program). The software is stored in a storage device (not shown) of the control unit 10. It is noted that the control unit 10 may be configured by a circuit formed from only hardware not including a computer.

In addition, the control unit 10 is provided with a function of a phase locked loop (PLL: Phase Locked Loop) 10p.

It is noted that a control power supply voltage needed in the power supply device 100 can be obtained from the storage battery 8.

<<Basic Operation of Power Supply Device>>

In the power supply device 100, normally, the plug 1 is connected to an outlet 11 of a commercial power supply or the like, and an electric apparatus (not shown) as a load is connected to the AC output outlet 3.

Normally, the control unit 10 executes a "current conduction mode" in which a voltage inputted from the external outlet 11 is directly outputted to the AC output outlet 3. At this time, the relay contact 91 is closed and the semiconductor switch 90 is opened. The semiconductor switch 90 is temporarily used at the time of closing the AC switch 9 and at the time of opening the AC switch 9, by virtue of fast response of the semiconductor switch 90. In addition, the control unit 10 performs power conversion from AC to DC using the conversion unit 7, to charge the storage battery 8.

In a case of supplying a power from the storage battery 8 to the load, the control unit 10 opens the AC switch 9. In addition, the control unit 10 causes the conversion unit 7 to perform power conversion from DC to AC, to execute a "storage battery discharge mode" in which a power discharged from the storage battery 8 is supplied to the load.

In a case where the power supply device 100 is used for backup purpose, if power outage of the commercial power supply or the like occurs or the plug 1 is extracted from the outlet 11 (hereinafter, such a case is simply referred to as power outage), the power supply device 100 detects the power outage and shifts from the current conduction mode to the storage battery discharge mode. Thereafter, if the power is restored, the power supply device 100 detects the power restoration and shifts from the storage battery discharge mode to the current conduction mode.

Hereinafter, power outage detection and a process therefor, and power restoration detection and a process therefor, will be described.

<<Power Outage Detection and Process Therefor>>

In a normal state before power outage occurs, the control unit 10 executes the current conduction mode in which the inputted voltage is directly outputted to the AC output outlet 3 via the closed AC switch 9. The control unit 10 can acquire the input voltage on the basis of a detection signal from the voltage sensor 5. Then, the control unit 10 generates a simulated voltage waveform with a phase synchronized with the input voltage, by using the phase locked loop 10p.

Figure 2:
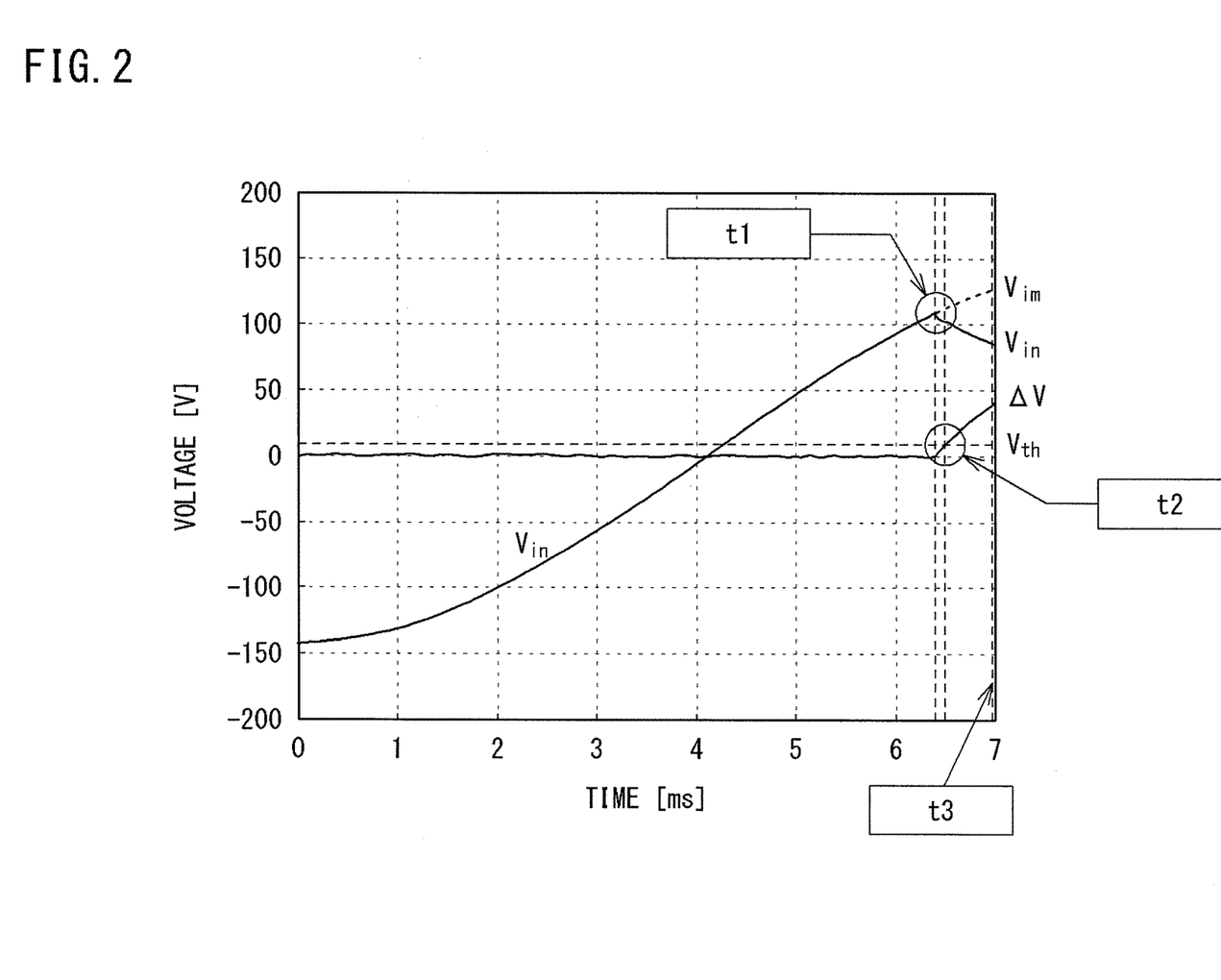
FIG. 2 is a graph showing an example of an input voltage waveform (single-phase AC waveform).
Figure 3:
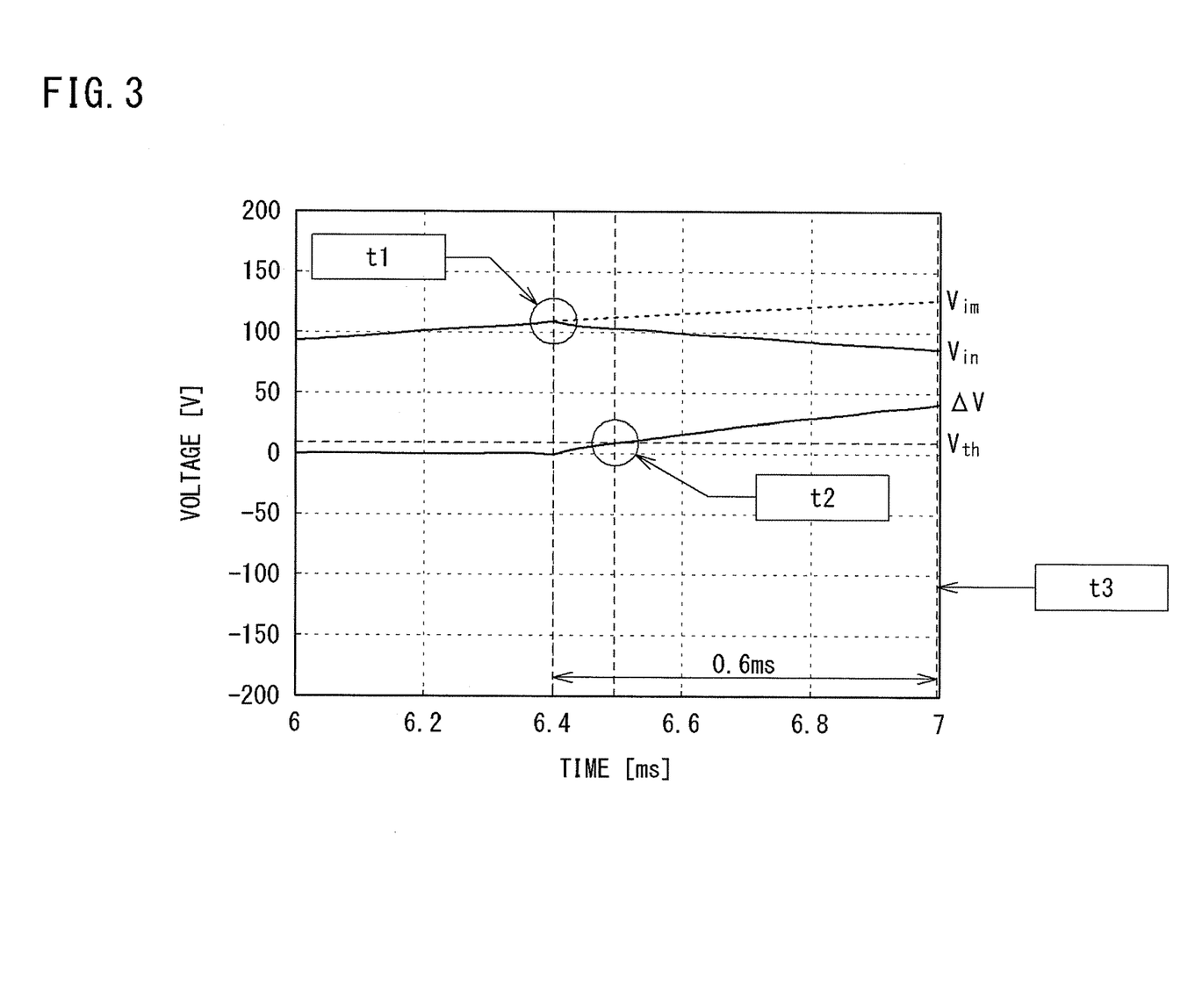
FIG. 3 is a graph obtained by horizontally elongating the time axis in the interval from time 6 ms to time 7 ms in FIG. 2.

FIG. 2 is a graph showing an example of an input voltage waveform (single-phase AC waveform). The horizontal axis indicates time [ms], and the vertical axis indicates voltage [V]. FIG. 3 is a graph obtained by horizontally elongating the time axis in the interval from time 6 ms to time 7 ms in FIG. 2. In FIG. 2, in a state in which the input voltage is normal, an input voltage waveform $V_{in}$ and a simulated voltage waveform $V_{in}$ coincide with each other. Therefore, a difference voltage ΔV therebetween is 0 V.

In FIG. 3, for example, if power outage occurs at time t1 of 6.4 ms, some difference voltage ΔV starts to arise. About 0.1 ms after the difference voltage ΔV starts to arise, the difference voltage ΔV becomes equal to or greater than a threshold value $V_{th}$ (threshold value for abnormality detection). The threshold value $V_{th}$ is provided in order to ignore a minute difference voltage ΔV. Here, at time t2, the control unit 10 starts determination, i.e., starts to count time, and at time t3 at which the difference voltage ΔV has continued being equal to or greater than the threshold value $V_{th}$ during a predetermined period (e.g., 0.5 ms), the control unit 10 determines that power outage has occurred. In this example, the total time required until power outage determination from occurrence of the power outage is about 0.6 ms. It is noted that the above expression "equal to or greater than a threshold value" may be "greater than a threshold value". That is, which side a case where the difference voltage ΔV is equal to the threshold value $V_{th}$ should be considered as, can be optionally decided.

Thus, power outage detection can be performed in 1 ms or shorter. It is noted that not only power outage but also other temporary abnormality, e.g., long-term voltage reduction which is not an instantaneous power outage level, can be determined as abnormality of the input voltage in the same manner.

That is, the control unit 10 of the power supply device 100, or an abnormality detection method for single-phase AC input voltage executed by the control unit 10, basically performs the following:

(1) sequentially generating a simulated voltage waveform with a phase synchronized with the input voltage, by using the phase locked loop 10p; and (2) within a period until a next update of the generated simulated voltage waveform, comparing the instantaneous value of the input voltage with the simulated voltage waveform, and when the instantaneous value of the input voltage changes from a state of being along the simulated voltage waveform to a state of not being along the simulated voltage waveform, determining that the input voltage is abnormal.

Regarding whether the instantaneous value of the input voltage is along the simulated voltage waveform, as described above, for example, a case in which the difference voltage between the instantaneous value of the input voltage and the simulated voltage waveform is greater than the threshold value, can be considered as a state in which the instantaneous value is not along the simulated voltage waveform.

The above "period until a next update" is ensured to be longer than the time required for abnormality determination. Therefore, it is possible to detect abnormality of the input voltage before the simulated voltage waveform is updated. At the time of initial operation, abnormality determination is performed after the first simulated voltage waveform is generated. Therefore, it is not erroneously determined that abnormality has occurred, before the first simulated voltage waveform is generated.

The power supply device 100 or the input-voltage-abnormality detection method as described above makes it possible to have a simulated voltage waveform by phase synchronization made before abnormality occurs on the input voltage. Then, for example, if power outage occurs on the supplied input voltage, the instantaneous value of the input voltage falls into a state of not being along the simulated voltage waveform. This state can be quickly detected as power outage. In addition, temporary abnormality of the input voltage can also be detected in the same manner.

It is preferable that the input voltage is determined to be abnormal if the "state of not being along the simulated voltage waveform" continues during a predetermined period (in the above example, 0.5 ms).

Thus, voltage variation that will be quickly restored, such as instantaneous power outage or instantaneous disturbance, can be prevented from being determined as abnormality of the input voltage.

If abnormality of the input voltage such as power outage is detected, the control unit 10 causes the conversion unit 7 to start conversion operation from DC to AC, and opens the AC switch 9 to shift from the current conduction mode to the storage battery discharge mode.

(Comparative Verification)

Figure 4:
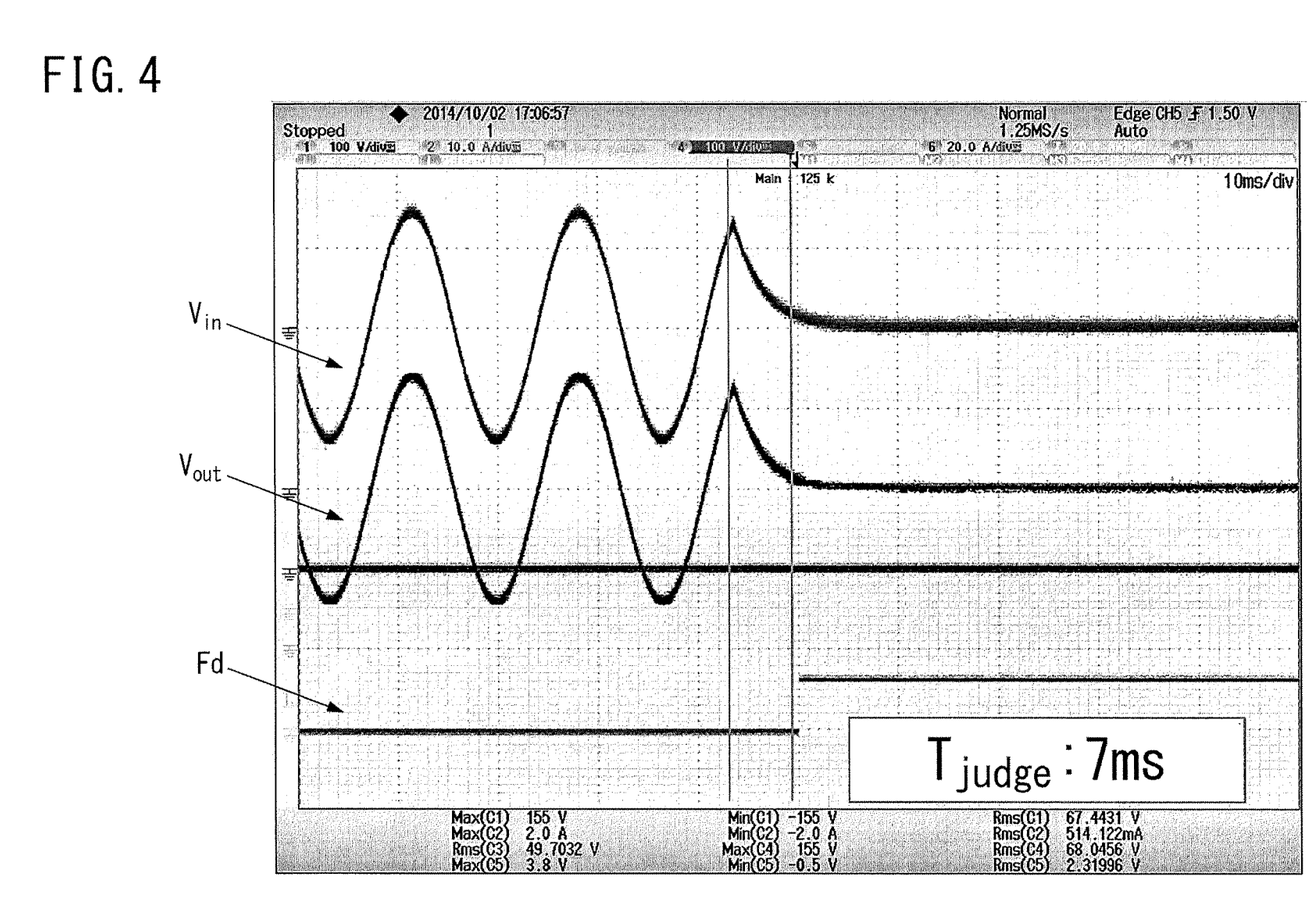
FIG. 4 is an image of an oscilloscope showing an actual example of conventional power outage detection shown in FIG. 11.

FIG. 4 is an image of an oscilloscope showing an actual example of the conventional power outage detection shown in FIG. 11. From the above, an input voltage waveform $V_{in}$, an output voltage waveform $V_{out}$, and a state of a power outage detection flag Fd are shown. In this case, 7 ms is required as a period $T_{judge}$ from occurrence of power outage until it can be determined that power outage has occurred.

Figure 5:
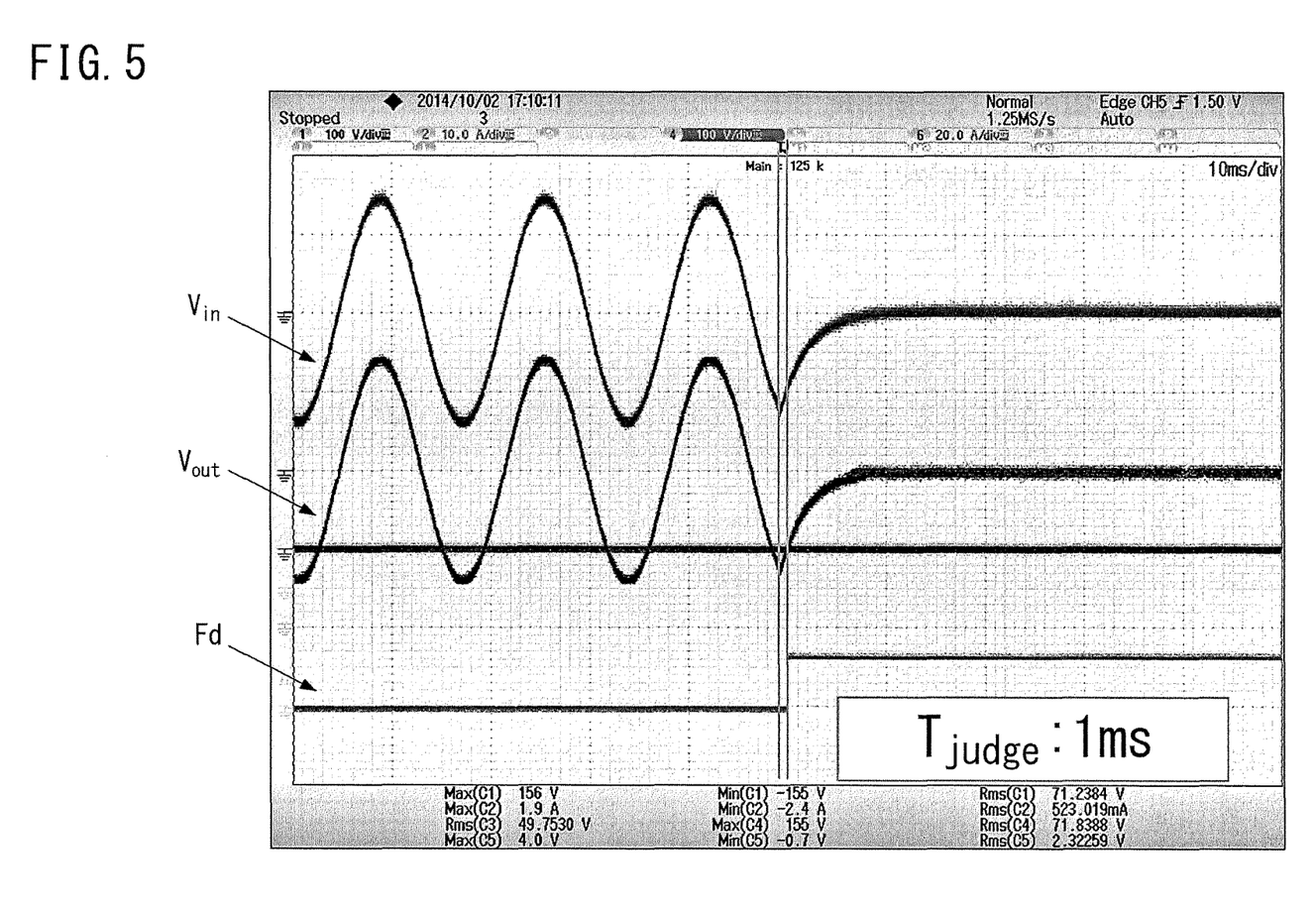
FIG. 5 is an image of an oscilloscope showing an actual example of power outage detection according to the embodiment.

On the other hand, FIG. 5 is an image of an oscilloscope showing an actual example of the power outage detection according to the above embodiment. From the above, an input voltage waveform $V_{in}$, an output voltage waveform $V_{out}$, and a state of a power outage detection flag Fd are shown. In this case, a period $T_{judge}$ required from occurrence of power outage until it can be determined that power outage has occurred is only 1 ms.

<<Power Restoration Detection and Process Therefor>>

If the input voltage supplied from outside is restored during execution of the storage battery discharge mode, a detection signal is sent from the first voltage sensor 5. Accordingly, the control unit 10 confirms whether the absolute value on the plus side of the input voltage is equal to or greater than 80 V (step 1), and subsequently, confirms whether the absolute value on the minus side of the input voltage is equal to or greater than 80 V (step 2). If it is confirmed that the absolute values on the plus side and the minus side are both equal to or greater than 80 V, this can be regarded as power restoration detection. Next, the control unit 10 establishes phase synchronization between the output voltage of the conversion unit 7 and the input voltage, and thereafter, at a zero-cross point of the input voltage, the control unit 10 stops output of the conversion unit 7 and at the same time, closes the AC switch 9. In the phase synchronization, for example, the phase of output of the conversion unit 7 is finely adjusted by using the phase locked loop 10p, whereby the phase of the output voltage of the conversion unit 7 can be brought close to the phase of the input voltage. It is noted that, in the power supply switching due to power restoration, quickness is not much important, but rather, phase matching is important.

In phase synchronization determination, for example, the control unit 10 determines whether the output voltage of the conversion unit 7 at a zero-cross point when the input voltage changes from minus to plus is close to phase 0 (step 3), and subsequently, determines whether the output voltage of the conversion unit 7 at a zero-cross point when the input voltage changes from plus to minus is close to phase π (step 4). If the conditions in the above steps 1 to 4 are consecutively satisfied, the control unit 10 executes shifting of the mode and closing of the AC switch 9. If the conditions in the above steps 1 to 4 are not satisfied, the control unit 10 repeatedly executes steps 1 to 4.

As another determination method for phase synchronization, the control unit 10 may determine that phase synchronization is established if a difference voltage between the instantaneous value of the input voltage and a stored simulated voltage waveform becomes smaller than a threshold value for synchronization detection (or becomes equal to or smaller than the threshold value). In this case, it is possible to reliably perform the determination by comparing the difference voltage with the threshold value. It is preferable that the threshold value for synchronization detection is different from the aforementioned threshold value for abnormality detection. For example, the following relationship may be satisfied.

Threshold Value for Abnormality Detection>Threshold Value for Synchronization Detection>0

By setting the threshold values to be different from each other as described above, it is possible to prevent shifting between the modes from being frequently performed within a short time.

(Verification)

Figure 6:
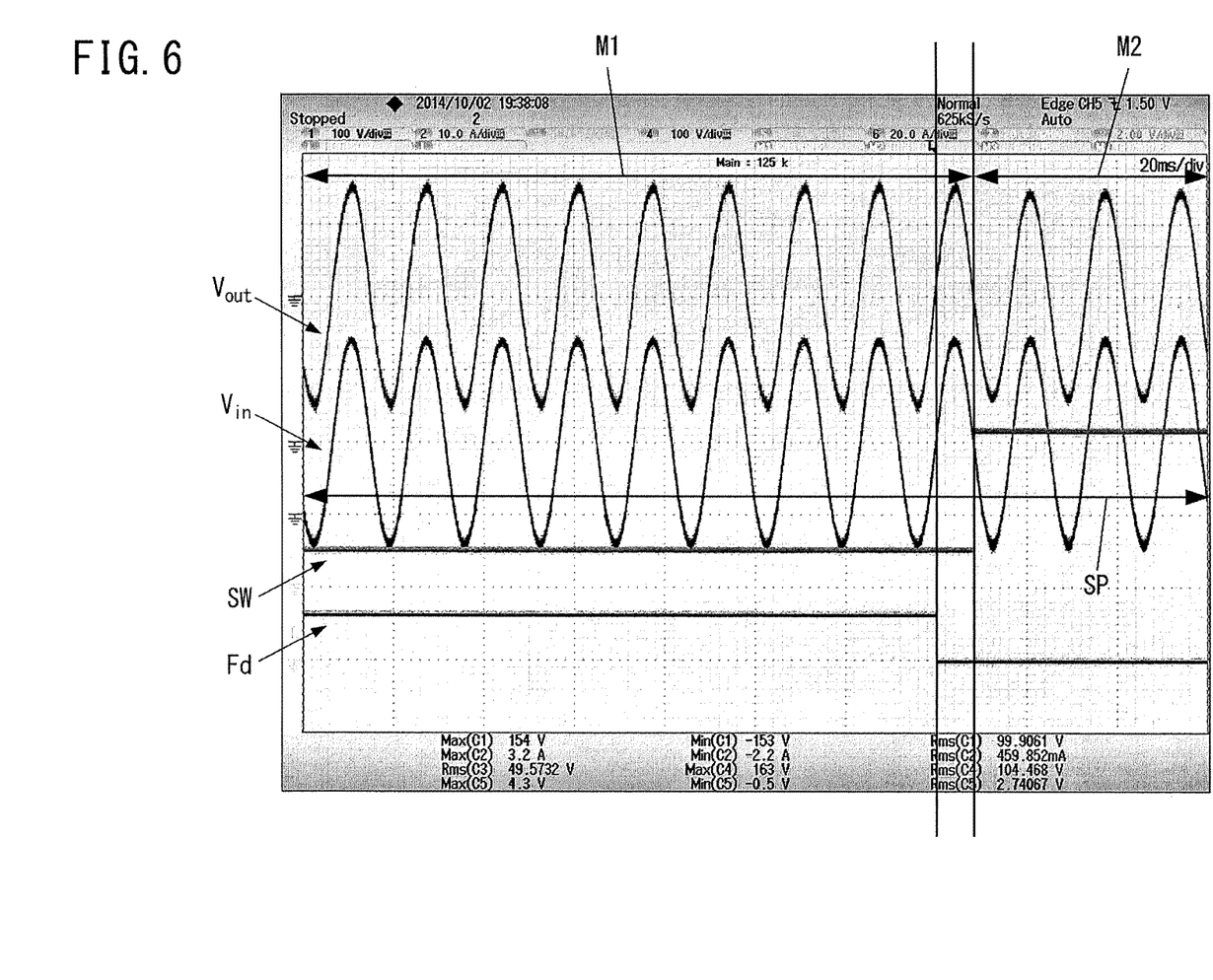
FIG. 6 is an image of an oscilloscope showing an actual example of power supply switching operation (mode shift) upon power restoration, according to the embodiment.

FIG. 6 is an image of an oscilloscope showing an actual example of power supply switching operation (shifting from storage battery discharge mode M1 to current conduction mode M2) upon power restoration, according to the above embodiment. The upper one of the two AC waveforms is the output voltage waveform $V_{out}$ of the conversion unit 7, and the lower one is the input voltage waveform $V_{in}$. Of the four lines shown in the image, the upper two lines with a step therebetween indicate an operation state SW (H level: closed, L level: opened) of the semiconductor switch 90. The lower two lines with a step therebetween indicate a state of a power outage determination flag Fd. A symbol SP indicates the range of grid output. Even if the semiconductor switch 90 is operated from an opened state to a closed state, variation in the output voltage cannot be seen on this image.

Figure 7:
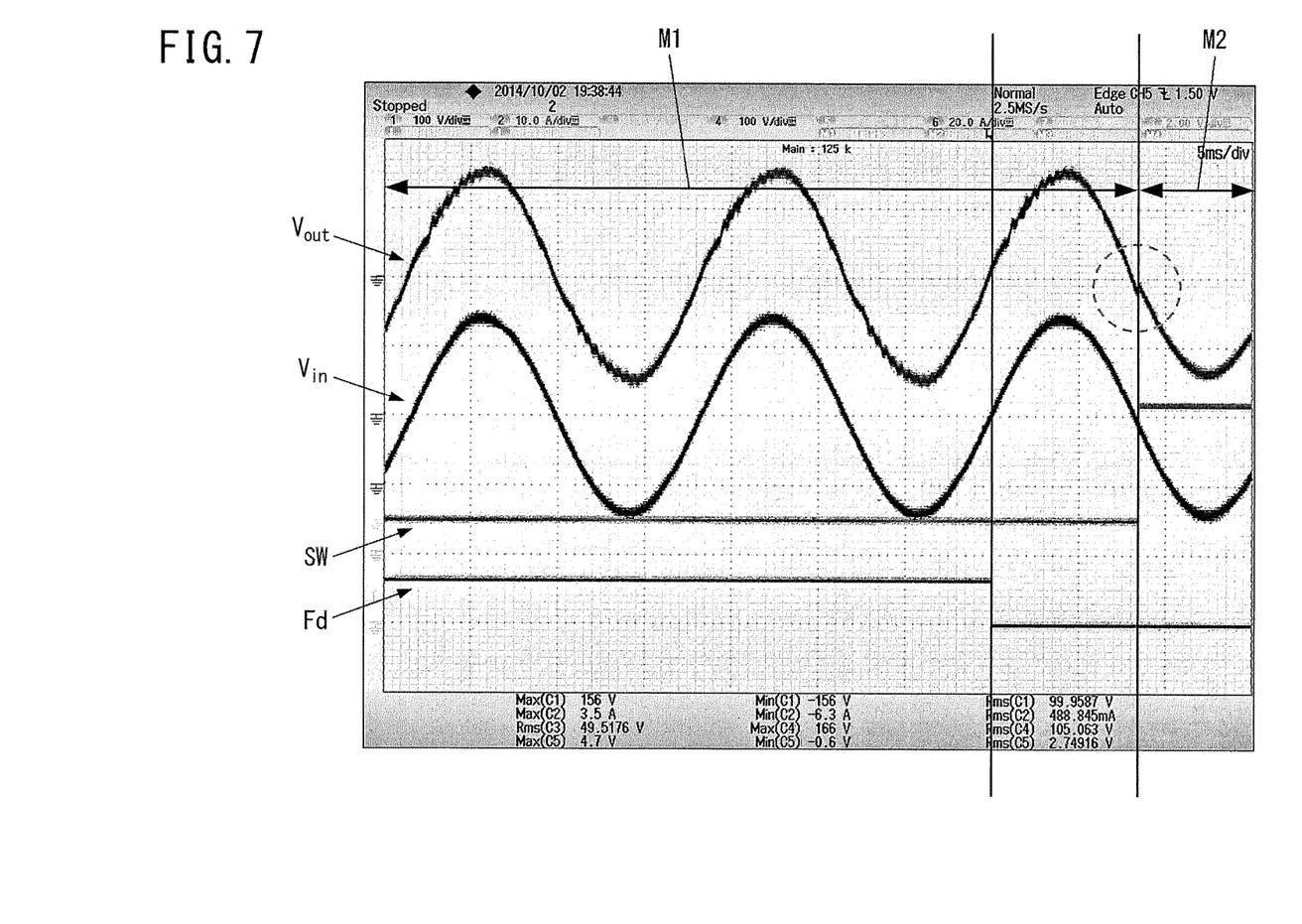
FIG. 7 is an image obtained by elongating the time on the horizontal axis in FIG. 6.

FIG. 7 is an image obtained by elongating the time on the horizontal axis in FIG. 6. At the zero-cross point enclosed by a dotted line circle, phase synchronization is made and the semiconductor switch 90 is closed. Thus, the output voltage waveform $V_{out}$ is switched from output of the conversion unit 7 to the external input voltage waveform $V_{in}$. In this way, power supply switching is smoothly performed, so that the switching has no influence on the load.

Figure 8:
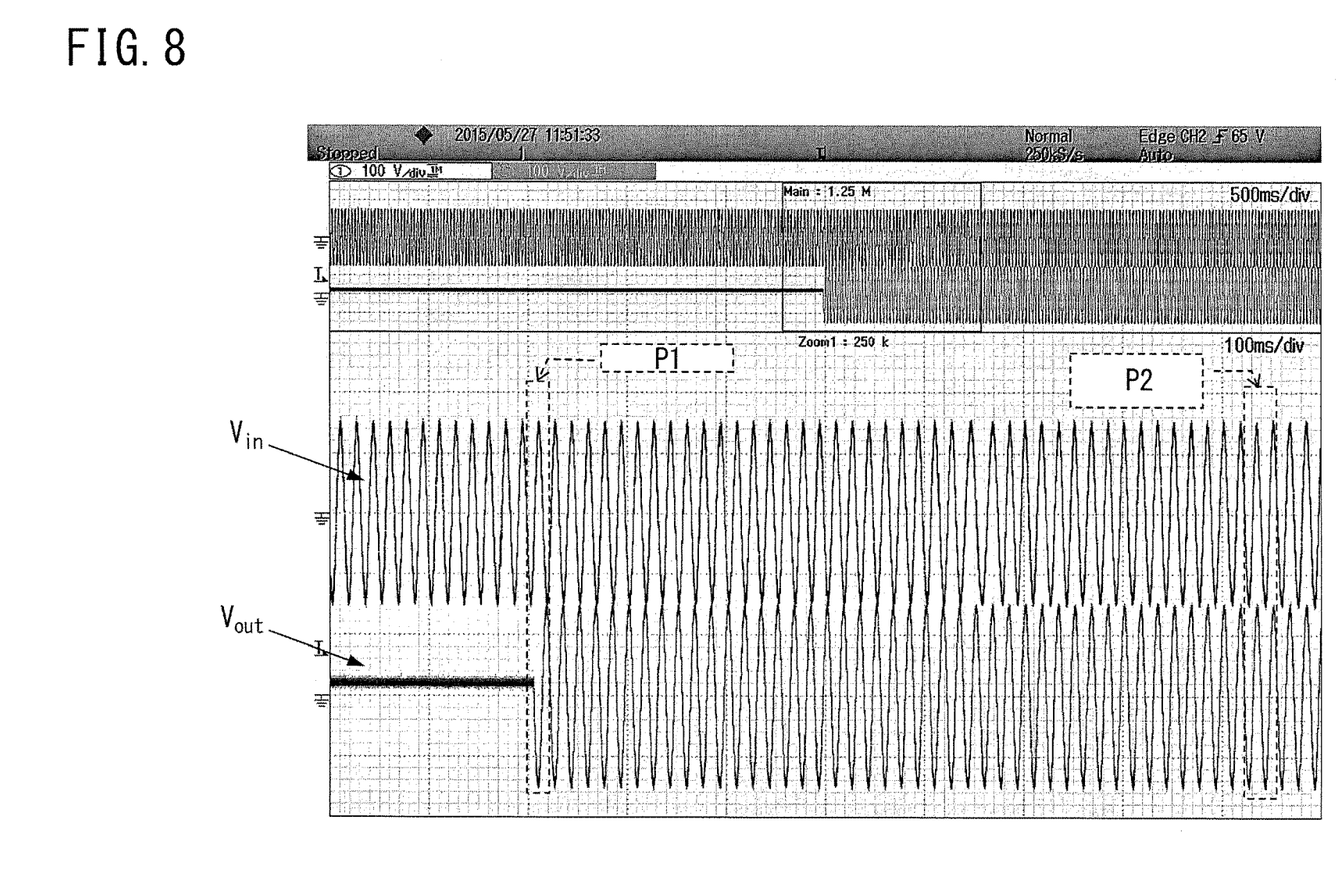
FIG. 8 is an image of an oscilloscope showing an example of waveforms of an input voltage and an output voltage from power restoration to power supply switching (mode shift).

FIG. 8 is an image of an oscilloscope showing an example of waveforms of the input voltage and the output voltage from power restoration to power supply switching (mode shift). The waveforms at the lower stage are obtained by expanding a part enclosed by a rectangle in the dense waveforms at the upper stage. Of the waveform is at the lower stage, the upper one is the input voltage waveform $V_{in}$, and the lower one is the output voltage waveform $V_{out}$. After restoration of the input voltage (at part enclosed by vertically elongated rectangle of broken line indicated by P1), when, in this example, about 40 cycles have passed, phase synchronization is established, and then the control unit 10 stops output of the conversion unit 7 (at part enclosed by vertically elongated rectangle of broken line indicated by P2), and closes the AC switch 9.

<<Supplement Regarding Phase Locked Loop>>

Supplemental explanation for the single-phase AC PLL will be given below. Regarding the AC PLL, it is general that the zero-cross point of the single-phase AC voltage is extracted to calculate the phase and the frequency. However, the accuracy is likely to decrease in a case where distortion is included in the waveform of the input voltage or measurement accuracy is poor due to noise.

As a reference, a case of three-phase AC PLL will be shown. If voltages for phases u, v, w are denoted by Vu, Vv, Vw, these can be converted to voltages Vα, Vβ in an α-β coordinate system obtained through orthogonal coordinate conversion from three-phase to two-phase, by the following expression (1).

$$\begin{bmatrix} V_\alpha \\ V_\beta \end{bmatrix} = \sqrt{\frac{2}{3}} \begin{bmatrix} 1 & -\frac{1}{2} & -\frac{1}{2} \\ 0 & \frac{\sqrt{3}}{2} & -\frac{\sqrt{3}}{2} \end{bmatrix} \begin{bmatrix} V_u \\ V_v \\ V_w \end{bmatrix} \quad (1)$$

These can be further converted to voltages Vd, Vq in a d-q coordinate system which is a rotating coordinate system, by the following expression (2) using a phase θr.

$$\begin{bmatrix} V_d \\ V_q \end{bmatrix} = \begin{bmatrix} \sin(\theta_r) & -\cos(\theta_r) \\ \cos(\theta_r) & \sin(\theta_r) \end{bmatrix} \begin{bmatrix} V_\alpha \\ V_\beta \end{bmatrix} \quad (2)$$

The voltages Vd, Vq have linear waveforms, and if PLL is appropriately performed, Vq becomes zero. Accordingly, by performing feedback control so as to satisfy voltage Vq=0, it is possible to achieve accurate phase synchronization.

Then, as the single-phase AC phase locked loop 10p, a single-phase AC PLL using the concept of the three-phase AC PLL will be described. In the single-phase AC PLL, the single-phase AC input voltage is applied to Vα in the α-β coordinate system. Although Vβ does not exist, Vβ is created from Vα in a pseudo manner.

Figure 9:
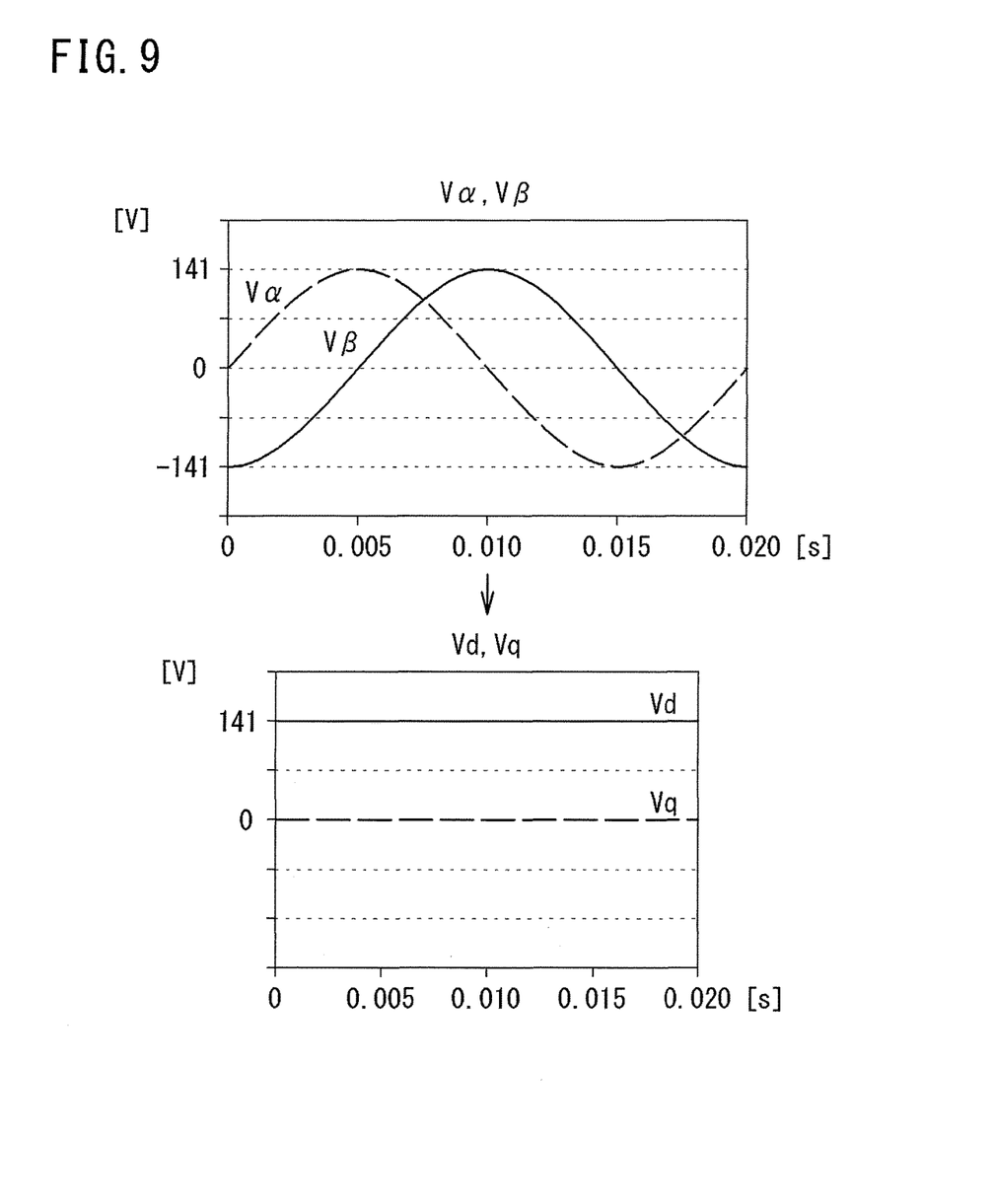
FIG. 9 is a waveform diagram in which a graph at the upper stage shows waveforms of $V\alpha$, $V\beta$ and a graph at the lower stage shows linear waveforms of $Vd$, $Vq$.

In FIG. 9, the graph at the upper stage shows waveforms of Vα, Vβ. These can be further converted to voltages Vd, Vq in a d-q coordinate system by the above expression (2).

In FIG. 9, the graph at the lower stage shows linear waveforms of Vd, Vq, and if PLL is appropriately performed, Vq becomes zero. It is noted that, depending on the way of defining the coordinate axes, a case of Vd=0 can occur, but both cases are essentially the same.

Figure 10:
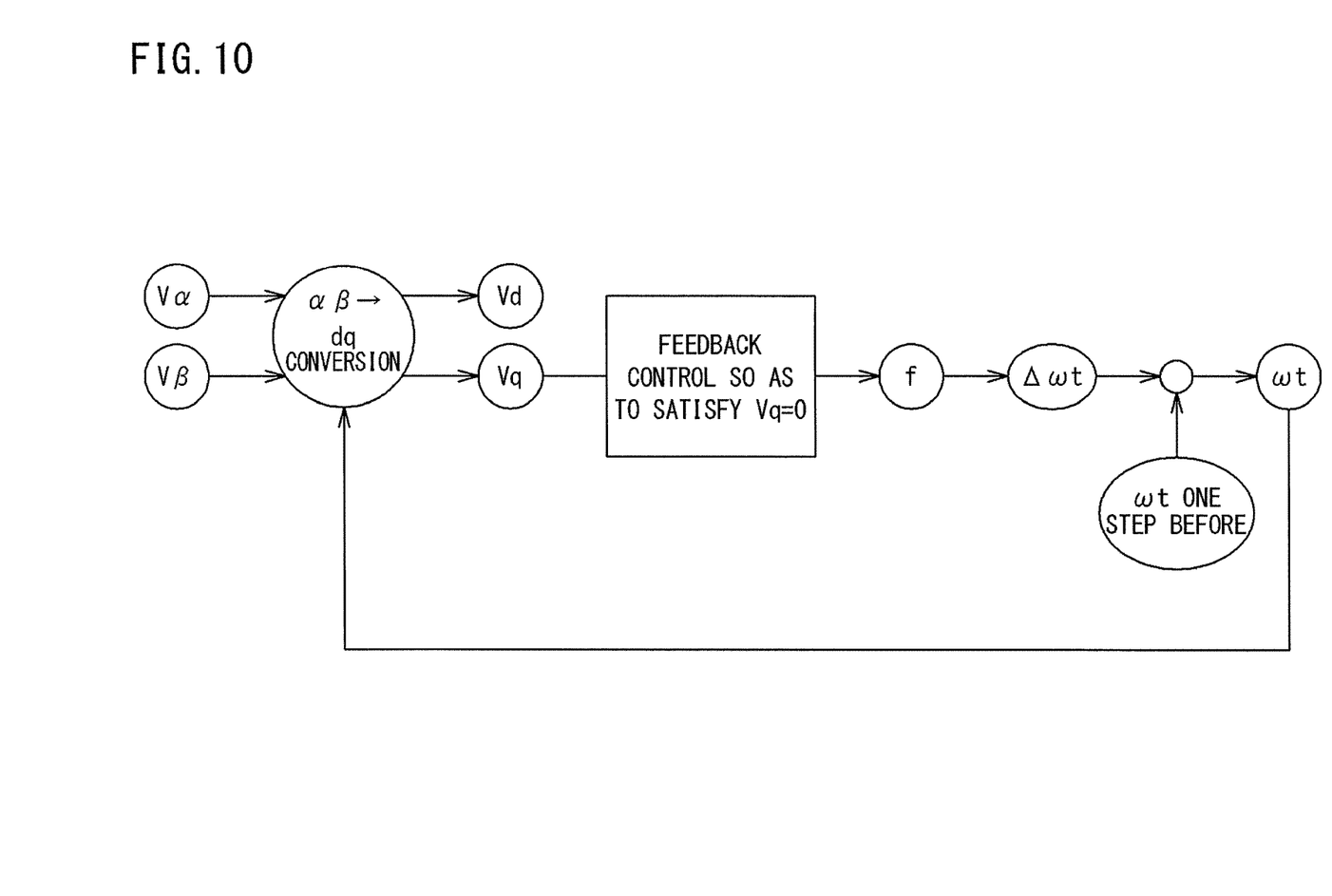
FIG. 10 is a control block diagram of PLL subsequent to $V\alpha$, $V\beta$, which is required as single-phase AC PLL.

FIG. 10 is a control block diagram of PLL subsequent to Vα, Vβ, which is required as single-phase AC PLL.

In FIG. 10, the voltages Vα, Vβ in the α-β coordinate system become voltages Vd, Vq through conversion into the d-q coordinate system. Feedback control is performed so as to satisfy voltage Vq=0, whereby a frequency f and a phase adjustment value Δωt are determined. This Δωt is added to the value of ωt that is one step before, whereby a new value of ωt is determined.

It is noted that, for the voltage Vβ, the derivative of Vα can be used, for example.

If the frequency of the single-phase alternating current is denoted by f1, time is denoted by t, and Vα and Vβ are represented as Vα=sin θ and Vβ=−cos θ, Vβ can be considered as a waveform obtained by delaying the waveform of Vα by 90 degrees (π/4 [rad]).

If Vα and Vβ are represented as Vα=A sin(2πf1t) and Vβ=−A cos(2πf1t), the following expression is obtained.

$$dV\alpha/dt = 2\pi f1 \cdot A \cos(2\pi f1 t) = -2\pi f1 V\beta \quad (3)$$

From the above expression, the following expression is obtained.

$$V\beta = -1/(2\pi f1) \times dV\alpha/dt \quad (4)$$

Thus, Vβ can be represented using the derivative of Vα.

In discretized expression as in calculation by software, if the number of times of sampling per cycle is denoted by N, the sampling frequency is denoted by fs (=N·f1), the sampling cycle is denoted by Δt (=1/fs), any natural number within the range of N is denoted by n (≤N), and a value obtained by subtracting (n−1)-th Vα from n-th Vα is denoted by ΔVα, the following expression is obtained.

$$V\beta = (-1/2\pi f1) \times (\Delta V\alpha/\Delta t)$$
$$= (-fs/2\pi f1) \times \Delta V\alpha \quad (5)$$

where, ΔVα=Vα(n-th)−Vα((n−1)-th).

In the above expressions (4), (5), f1 is included in a coefficient of Vβ, and the coefficient is a function of f1. Therefore, even if phase variation occurs, Vβ varies so as to follow the variation in f1. That is, response to phase variation is excellent.

<<Supplement>>

The input-voltage-abnormality detection method according to the above embodiment has been described with respect to the power supply device 100. However, without limitation to the power supply device, the abnormality detection method is also applicable to other devices that need power outage detection or the like.

The AC switch 9 in FIG. 1 is not limited to the shown configuration example, but may be configured by only the semiconductor switch 90 or only the relay contact 91.

It is noted that the embodiments disclosed herein are merely illustrative in all aspects and should not be recognized as being restrictive. The scope of the present invention is defined by the scope of the claims, and is intended to include meaning equivalent to the scope of the claims and all modifications within the scope.

REFERENCE SIGNS LIST 1 plug
2 earth leakage circuit breaker
3 AC output outlet
4 AC path
5 first voltage sensor
6 second voltage sensor
7 conversion unit
7a bidirectional inverter
7b DC/DC converter
8 storage battery
9 AC switch
10 control unit
10p phase locked loop
11 outlet
90 semiconductor switch
91 relay contact
100 power supply device
Tin input end
Tout output end
P connection point
Q1, Q2 semiconductor switch element
d1, d2 parallel diode

The invention claimed is:

1. A power supply device comprising:
a single-phase AC path from an input end to an output end in the power supply device;
a first voltage sensor configured to detect an input voltage at the input end;
a second voltage sensor configured to detect an output voltage at the output end;
a conversion unit connected to the AC path and being capable of bidirectional power conversion;
a storage battery connected to the AC path via the conversion unit;
an AC switch provided between the input end and a point at which the conversion unit is connected to the AC path; and
a control unit configured to control the conversion unit and the AC switch, thereby having a current conduction mode in which a power is supplied from the input end through the AC switch which is closed and the AC path, to reach the output end and thus supplied to a load connected to the output end, and a storage battery discharge mode in which the AC switch is opened and a power is supplied from the storage battery to the load via the conversion unit, wherein
the control unit has a function of a phase locked loop, and sequentially generates a simulated voltage waveform with a phase synchronized with the input voltage, by using the phase locked loop, and
within a period until a next update of the generated simulated voltage waveform, compares an instantaneous value of the input voltage with the simulated voltage waveform, and when the instantaneous value of the input voltage changes from a state of being along the simulated voltage waveform to a state of not being along the simulated voltage waveform, determines that the input voltage is abnormal, and shifts from the current conduction mode to the storage battery discharge mode.

2. The power supply device according to claim 1, wherein when a difference voltage between the instantaneous value of the input voltage and the simulated voltage waveform is greater than a threshold value for abnormality detection, the control unit determines that the instantaneous value of the input voltage is in the state of not being along the simulated voltage waveform.

3. The power supply device according to claim 2, wherein when a state in which the difference voltage is greater than the threshold value has continued during a predetermined period, the control unit determines that the input voltage is abnormal.

4. The power supply device according to claim 2, wherein when the input voltage is restored after the shifting to the storage battery discharge mode, the control unit synchronizes a phase of an output voltage of the conversion unit with the input voltage, by using the phase locked loop, and when the phase synchronization is established, the control unit shifts from the storage battery discharge mode to the current conduction mode.

5. The power supply device according to claim 4, wherein when the difference voltage has become smaller than a threshold value for synchronization detection, the control unit determines that the phase synchronization is established.

6. The power supply device according to claim 5, wherein the threshold value for abnormality detection and the threshold value for synchronization detection are values different from each other.

7. The power supply device according to claim 3, wherein when the input voltage is restored after the shifting to the storage battery discharge mode, the control unit synchronizes a phase of an output voltage of the conversion unit with the input voltage, by using the phase locked loop, and when the phase synchronization is established, the control unit shifts from the storage battery discharge mode to the current conduction mode.

8. The power supply device according to claim 7, wherein when the difference voltage has become smaller than a threshold value for synchronization detection, the control unit determines that the phase synchronization is established.

9. The power supply device according to claim 8, wherein the threshold value for abnormality detection and the threshold value for synchronization detection are values different from each other.

\* \* \* \* \*